(12) United States Patent
Kawakami et al.

(10) Patent No.: US 8,343,584 B2
(45) Date of Patent: Jan. 1, 2013

(54) METHOD OF MANUFACTURING A DECORATIVE ARTICLE, A DECORATIVE ARTICLE, AND A TIMEPIECE

(75) Inventors: Atsushi Kawakami, Nagano (JP); Yuzuru Tsukamoto, Yamagata-mura (JP)

(73) Assignee: Seiko Epson Corporation, Tokyo (JP)

( * ) Notice: Subject to any disclaimer, the term of this patent is extended or adjusted under 35 U.S.C. 154(b) by 225 days.

(21) Appl. No.: 12/950,303

(22) Filed: Nov. 19, 2010

(65) Prior Publication Data

US 2011/0123815 A1    May 26, 2011

(30) Foreign Application Priority Data

Nov. 25, 2009   (JP) ................................. 2009-268039

(51) Int. Cl.
*B05D 3/10*   (2006.01)
(52) U.S. Cl. ..... 427/343; 427/250; 427/337; 427/383.1; 427/383.3; 427/383.7; 427/398.1; 427/404; 427/405; 427/419.1; 427/419.7
(58) Field of Classification Search .................. None
See application file for complete search history.

(56) References Cited

U.S. PATENT DOCUMENTS

| | | | | |
|---|---|---|---|---|
| 4,252,862 A | * | 2/1981 | Nishida | 428/627 |
| 4,415,421 A | * | 11/1983 | Sasanuma | 204/192.15 |
| 2004/0168927 A1 | | 9/2004 | Matsushita | |
| 2009/0233123 A1 | | 9/2009 | Kawakami et al. | |
| 2010/0227156 A1 | | 9/2010 | Satoh et al. | |

FOREIGN PATENT DOCUMENTS

| | | |
|---|---|---|
| CN | 101538712 A | 9/2009 |
| JP | 64-062478 A | 3/1989 |
| JP | 2008-240061 A | 10/2008 |
| JP | 2008-240062 A | 10/2008 |
| JP | 2009-213616 A | 9/2009 |
| JP | 2009-215593 A | 9/2009 |
| WO | WO-03/010357 A1 | 2/2003 |
| WO | WO-2009/038152 A1 | 3/2009 |

\* cited by examiner

*Primary Examiner* — Erma Cameron
(74) *Attorney, Agent, or Firm* — Global IP Counselors, LLP

(57) ABSTRACT

A method of manufacturing a decorative article, including a first coating formation step of forming a first coating of primarily TiN on a substrate; a second coating formation step of forming a second coating on the first coating by means of a dry plating method using a target containing 70.0 wt %≦85.0 wt % Au and 15.0 wt %≦30.0 wt % Cu; a heat treatment step of promoting formation of a solid solution of the constituents of the second coating by applying a heating process that heats the substrate on which the first coating and the second coating are disposed to 300° C.≦395° C. and then applying a cooling process; and an acid treatment step that, of the constituents of the second coating to which the heating process was applied, removes the constituents not forming a solid solution by applying an acid treatment.

8 Claims, 2 Drawing Sheets ered, is compact, and affords outstanding durability and reliability.

METHOD OF MANUFACTURING A DECORATIVE ARTICLE, A DECORATIVE ARTICLE, AND A TIMEPIECE

BACKGROUND

1. Technical Field

The present invention relates to a method of manufacturing a decorative article, to a decorative article, and to a timepiece.

2. Related Art

An excellent appearance is essential to decorative articles such as the external parts of a timepiece. Metals such as Au, Pt, and Ag are commonly used to make such parts in order to achieve such an attractive appearance. Alloys such as pink gold, which provides a pink color with the luster of gold, are commonly used to produce decorative articles with a color and appearance that cannot be achieved by a pure metal. Japanese Unexamined Patent Appl. Pub. JP-A-S64-62478 teaches a decorative article that has a plated Au alloy coating with a pink color.

However, color variations occur easily with decorative articles that have such a plated pink Au alloy coating, and achieving a stable appearance is difficult. Furthermore, because the hardness of this alloy is low, the surface of decorative articles (such as external members of a timepiece and personal accessories) made from this alloy is easily scratched, and the appearance can therefore drop drastically with extended use.

SUMMARY

A method of manufacturing decorative articles according to the present invention can consistently produce decorative articles that have a pink luster, an outstanding appearance in which color variations in parts thereof are prevented, and outstanding durability. A decorative article according to the invention has a pink luster, an outstanding appearance in which color variations in parts thereof are prevented, and outstanding durability, and a timepiece according to the invention has said decorative article.

A first aspect of the invention is a method of manufacturing a decorative article, including a first coating formation step of forming a first coating of primarily TiN on a substrate; a second coating formation step of forming a second coating on the first coating by means of a dry plating method using a target containing 70.0 wt %≦85.0 wt % Au and 15.0 wt %≦30.0 wt % Cu; a heat treatment step of promoting formation of a solid solution of the constituents of the second coating by applying a heating process that heats the substrate on which the first coating and the second coating are disposed to 300° C.≦395° C. and then applying a cooling process; and an acid treatment step that, of the constituents of the second coating to which the heating process was applied, removes the constituents not forming a solid solution by applying an acid treatment.

The method of manufacturing a decorative article according to this aspect of the invention thus enables consistently producing decorative articles with a lustrous pink color, outstanding durability, and an outstanding appearance in which random variations in color are prevented.

In a method of manufacturing a decorative article according to another aspect of the invention, the acid treatment step causes the second coating supplied to the heat treatment step to contact a 50 wt %≦70 wt % HNO$_3$ solution for 1 second 180 second.

This aspect of the invention enables more reliably manufacturing decorative articles with an outstanding appearance, and affords outstanding productivity in the manufacture of decorative articles.

A method of manufacturing a decorative article according to another aspect of the invention also preferably has a base layer formation step that forms at least one base layer on the substrate before the first coating formation step.

This aspect of the invention enables imparting the finished decorative article with outstanding durability.

Further preferably, a layer of primarily Ti is formed as the base layer in a method of manufacturing a decorative article according to another aspect of the invention.

This aspect of the invention enables imparting the finished decorative article with outstanding durability.

In a method of manufacturing a decorative article according to another aspect of the invention, the substrate is made of primarily Ti and/or stainless steel at least near the surface of the substrate.

This aspect of the invention enables imparting the finished decorative article with outstanding durability.

In a method of manufacturing a decorative article according to another aspect of the invention, the N content of the first coating disposed to the decorative article is 2.0 wt %≦29.0 wt %.

This aspect of the invention enables more reliably manufacturing decorative articles with an outstanding appearance, enables imparting the decorative article with outstanding durability and reliability, and affords outstanding productivity in the manufacture of decorative articles.

In a method of manufacturing a decorative article according to another aspect of the invention, the average thickness of the first coating disposed to the decorative article is 0.1 μm≦5.0 μm.

This aspect of the invention enables more reliably manufacturing decorative articles with an outstanding appearance, enables imparting the decorative article with outstanding durability and reliability, and affords outstanding productivity in the manufacture of decorative articles.

In a method of manufacturing a decorative article according to another aspect of the invention, the average thickness of the second coating disposed to the decorative article is 0.02 μm≦2.0 μm.

This aspect of the invention enables imparting the decorative article with an outstanding appearance and reliability.

Another aspect of the invention is a decorative article that is manufactured using the method of the invention.

This aspect of the invention thus enables providing decorative articles with a lustrous pink color, outstanding durability, and an outstanding appearance in which random variations in color are prevented.

A decorative article according to another aspect of the invention is an external part of a timepiece.

The external parts of a timepiece are generally decorative articles that are easily subject to external impact, and require both a beautiful appearance as decorative parts and durability as utilitarian parts. The invention enables satisfying both of these requirements. More specifically, the effect of the invention is even more dramatic when the invention is applied to external timepiece parts.

A timepiece according to another aspect of the invention has a decorative article according to the invention.

This aspect of the invention affords a timepiece having a decorative part in which random color variations are prevented and an outstanding appearance with luster and a pink color can be maintained for a long time.

EFFECT OF THE INVENTION

The invention described herein provides a method of manufacturing a decorative article that enables consistently producing decorative articles with a lustrous pink color, outstanding durability, and an outstanding appearance in which random variations in color are prevented; a decorative article with a lustrous pink color, outstanding durability, and an outstanding appearance in which random variations in color are prevented; and a timepiece having said decorative article.

Other objects and attainments together with a fuller understanding of the invention will become apparent and appreciated by referring to the following description and claims taken in conjunction with the accompanying drawings.

DESCRIPTION OF EMBODIMENTS

Figure 1A:
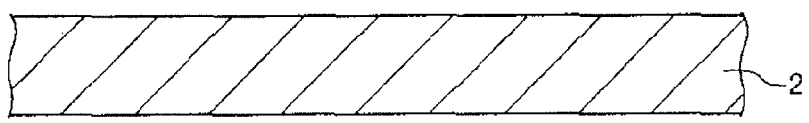
FIG. 1 is a section view describing a preferred embodiment of a method of manufacturing a decorative article according to the invention.
Figure 1B:
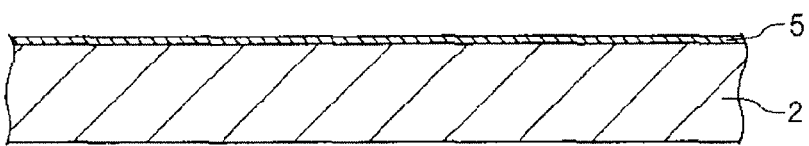
Figure 1C:
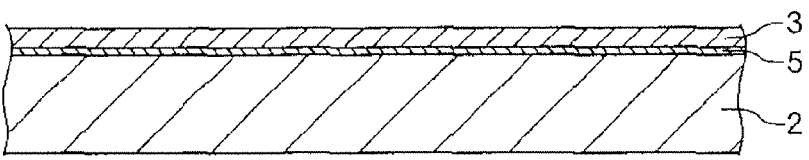
Figure 1D:
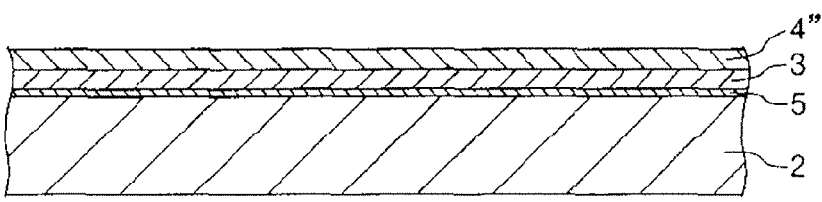
Figure 1E:
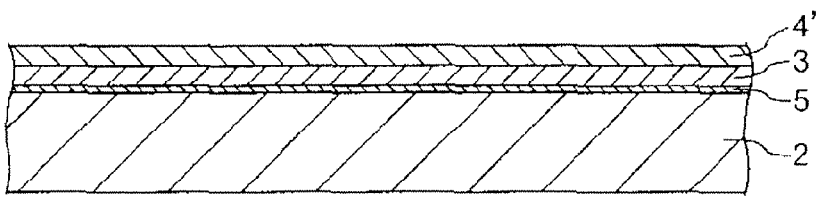
Figure 1F:
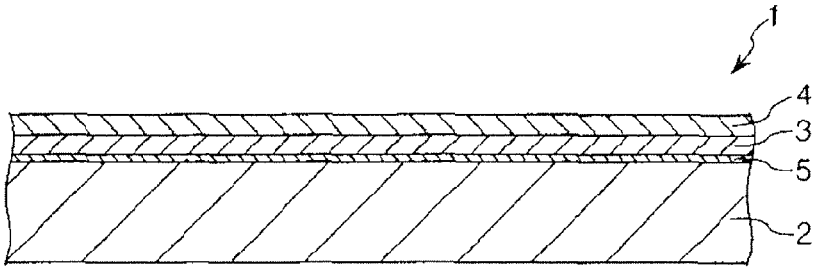

Preferred embodiments of the present invention are described below with reference to the accompanying figures. It should be noted that the drawings referenced herein emphasize particular parts of the invention, and do not accurately reflect the dimensions, proportions, and other aspects of the actual configurations of the invention.

Method of Manufacturing a Decorative Article

A preferred embodiment of a method of manufacturing a decorative article according to the invention is described first below.

FIG. 1 is a section view describing a preferred embodiment of a method of manufacturing a decorative article according to the invention.

As shown in FIG. 1, the manufacturing method according to this embodiment of the invention has a substrate preparation step (1a) that prepares the substrate 2, a base layer formation step (1b) that forms at least one base layer 5 on the substrate 2, a first coating formation step (1c) that forms a first coating 3 made of primarily TiN, a second coating formation step (1d) that forms a second coating 4" on the first coating 3 by a dry plating method, a heat treatment step (1e) that produces a solid solution from the constituent materials of the second coating 4" and thus renders a second coating 4' by applying a heating process and a cooling process to the substrate 2 on which the substrate 2 and second coating 4" are formed, and an acid treatment step (1f) that removes the constituents of the second coating 4' that are not rendered as a solid solution by means of an acid treatment and renders the second coating 4.

Substrate Preparation Step

The substrate 2 that is prepared in this step can be made of any desired material, including metallic and non-metallic materials.

When the substrate 2 is metal, a decorative article 1 with an excellent strength characteristic can be provided.

When the substrate 2 is made of metal and the surface roughness of the substrate 2 is relatively high, the surface roughness of the resulting decorative article 1 can be reduced by the leveling effect of forming the first coating 3 and second coating 4" described below. For example, even if mechanical processing such as grinding or polishing the surface of substrate 2 is not used, a mirror finish can still be achieved. A mirror surface can even be easily achieved when the substrate 2 is formed using a metal injection molding (MIM) method and the surface has a satin finish. A decorative article with excellent luster can thus be achieved.

If the substrate 2 is a non-metallic material, a decorative article 1 that is relatively light and portable and has a lustrous, high quality appearance can be achieved.

When the substrate 2 is a non-metallic material it can also be processed relatively easily to a desired shape. This makes it possible to manufacture relatively easily a decorative article 1 with a shape that is difficult to mold directly.

Furthermore, an electromagnetic noise shielding effect can also be achieved when the substrate 2 is a non-metallic material.

Metal materials that can be used for the substrate 2 include metals such as Fe, Cu, Zn, Ni, Mg, Cr, Mn, Mo, Nb, Al, V, Zr, Sn, Au, Pd, Pt, and Ag, and alloys (such as stainless steel or brass) containing at least one of these.

If at least the surface portion of the substrate 2 is made primarily from Ti and/or stainless steel, the decorative article 1 will have particularly outstanding hardness, and will be particularly resistant to surface damage such as scratching, marring, and denting. As a result, the decorative article 1 will be able to retain an outstanding appearance for a longer time. Furthermore, if at least the surface portion of the substrate 2 is made primarily from Ti and/or stainless steel (and particularly if primarily Ti), adhesion between the substrate 2 and the first coating 3 (particularly adhesion with the first coating 3 through the base layer 5 in this embodiment of the invention) described below will be particularly outstanding.

Note that as used herein "primarily" indicates the component with the highest content ratio of the materials constituting the subject part (member), and while the content is not specifically limited, it is preferably 70 wt % or more of the materials in the subject part (member), further preferably 90 wt % or more, and yet further preferably 95 wt % or more.

Examples of materials of primarily Ti include Ti (solid Ti) and Ti alloys. Exemplary stainless steel materials include Fe—Cr alloys and Fe—Cr—Ni alloys. Examples of Fe—Cr—Ni alloys include SUS 304, SUS 303, SUS 316, SUS 316L, SUS 316J1, and SUS 316J1L. Examples of Fe—Cr alloys include SUS 405, SUS 430, SUS 434, SUS 444, SUS 429, and SUS 430F.

If the substrate 2 is a non-metallic material it could be plastic, ceramic, stone, wood, or glass, for example.

Exemplary plastic materials include thermoplastic resins and thermosetting resins, such as polyethylene, polypropylene, ethylene-propylene copolymer, ethylene-vinyl acetate copolymer (EVA) and other polyolefins, cyclic polyolefins, denatured polyolefins, polyvinyl chloride, polyvinylidene chloride, polystyrene, polyamide (such as nylon 6, nylon 46, nylon 66, nylon 610, nylon 612, nylon 11, nylon 12, nylon 6-12, nylon 6-66), polyimide, polyamide-imide, polycarbonate (PC), poly-(4-methylbentene-1), ionomer, acrylic resins, polymethylmethacrylate, acrylonitrile-butadiene-styrene copolymer (ABS resin), acrylonitrile-styrene copolymer (AS resin), butadiene-styrene copolymer, polyoxymethylene, polyvinyl alcohol (PVA), ethylene vinyl alcohol copolymer (EVOH), polyethylene terephthalate (PET), polybutylene terephthalate (PBT), polycyclohexane terephthalate (PCT) and other polyesters, polyether, polyetherketone (PEK), polyetheretherketone (PEEK), polyether imide, polyacetal (POM), polyphenylene oxide, denatured polyphenylene oxide, polysulfone, polyethersulfone, polyphenylene sulfide, polyarylate, aromatic polyester (liquid crystal polymer), polytetrafluoroethylene, polyvinylidene fluoride, and other fluororesins, styrenes, polyolefins, polyvinyl chlorides, polyurethanes, polyesters, polyamides, polybutadienes, transpolyisoprenes, fluoroelastomers, polyethylene chlorides and other thermoplastic elastomers, epoxy resin, phenol resin, urea resin, melamine resin, unsaturated polyester, silicon resin, urethane resin, poly-para-xylylene, poly-monochloro-para-xylylene, poly-dichloro-para-xylylene, poly-monofluoro-para-xylylene, poly-monoethyl-para-xylylene, and other poly-para-xylylene resins, as well as copolymers, blends, and polymer alloys of primarily the foregoing, and one or two or more of the foregoing used together (as blended resins, polymer alloys, or laminates, for example).

If the substrate 2 is plastic, a decorative article 1 that is relatively light and portable while having a lustrous, high quality appearance can be achieved.

A plastic substrate 2 can also be molded relatively easily to a desired shape. This makes it possible to manufacture a decorative article 1 with a complicated shape relatively easily.

Furthermore, an electromagnetic noise shielding effect can also be achieved when the substrate 2 is made of plastic.

Exemplary ceramic materials include, for example, oxide ceramics such as $Al_2O_3$, $SiO_2$, $TiO_2$, $Ti_2O_3$, $ZrO_2$, $Y_2O_3$, barium titanate, and strontium titanate; nitride ceramics such as AlN, $Si_3N_4$, SiN, TiN, BN, ZrN, HfN, VN, TaN, NbN, CrN, and $Cr_2N$; graphite and carbide ceramics such as SiC, ZrC, $Al_4C_3$, $CaC_2$, WC, TiC, HfC, VC, TaC, and NbC; boride ceramics such as $ZrB_2$ and MoB; and compound ceramics combining any two or more such ceramics.

When the substrate 2 is made from such a ceramic, a decorative article 1 with high strength and high hardness in particular can be achieved.

The composition of the substrate 2 may be effectively uniform in each part thereof, or the composition may differ in different parts. For example, the substrate 2 may have a base layer and a surface layer disposed over the base layer. If the substrate 2 is thus rendered, greater freedom molding the substrate 2 can be achieved by appropriately selecting the material of the base layer, and even decorative articles 1 with relatively complicated shapes can be manufactured relatively easily.

If the substrate 2 has a base layer and a surface layer made of metal, the (average) thickness of the surface layer is not specifically limited but preferably is greater than or equal to 0.1 µm and less than or equal to 50 µm, and is further preferably greater than or equal to 1.0 µm and less than or equal to 10 µm. If the thickness of the surface layer is within this range, the substrate 2 can be rendered with sufficiently high hardness while also more reliably preventing unintended separation of the surface layer from the base layer.

In addition, the shape and size of the substrate 2 are not specifically limited, and are usually determined based on the shape and size of the decorative article 1.

The method of manufacturing the substrate 2 is not specifically limited.

Manufacturing methods that can be used when the substrate 2 is made from a metal material include pressing, cutting and grinding, forging, casting, powder metallurgy annealing, metal powder injection molding (MIM), and lost wax casting. Of these, casting and metal powder injection molding (MIM) are particularly desirable. Casting and metal powder injection molding (MIM) in particular offer excellent processing characteristics. As a result, a substrate 2 with a complex shape can be manufactured relatively easily using these methods.

If the substrate 2 is made from one of the above plastic materials, it can be manufactured by such methods as compression molding, extrusion molding, injection molding, and stereolithography.

If the substrate 2 is made from one of the above ceramic materials the invention shall not be particularly limited to any particular manufacturing technique, but metal injection molding (MIM) is preferred. Metal powder injection molding (MIM) in particular offers excellent processing characteristics, and a substrate 2 with a complex shape can therefore be manufactured relatively easily.

When the substrate 2 has a base part and a surface layer as described above, the substrate 2 can be manufactured as described below. More specifically, the substrate 2 is obtained by forming a surface layer on top of a base layer that is manufactured as described above. The surface layer can be formed by coating methods such as dipping, brushing, spraying, electrostatic coating, and electrodeposition coating; wet plating methods such as electrolytic plating, immersion plating, and electroless plating; chemical vapor deposition (CVD) methods such as thermal CVD, plasma CVD, and laser CVD methods; dry plating methods such as vacuum deposition, sputtering, and ion plating; and spray coating methods.

The surface of the substrate 2 may processed by planishing, embossing, satinizing, or other surface processing method. These processes make it possible to vary the surface luster of the decorative article 1, and can further improve the decorativeness of the resulting decorative article 1. Furthermore, compared with when surface processing is applied directly to the base layer 5, the first coating 3, or the second coating 4", undesirable surface glitter can be suppressed and a particularly outstanding appearance can be achieved in a decorative article 1 that is manufactured using a substrate 2 to which the desired surface processing technique is applied.

Furthermore, as described below, because the first coating 3 is made from a hard TiN alloy, the first coating 3 can be easily chipped or damaged during surface treatment if the surface treatment is applied directly to the first coating 3, and the production yield of the decorative article 1 may drop dramatically. This problem can be prevented effectively, however, by applying the surface processing treatment to the substrate 2. Surface treatment of the substrate 2 is also possible under more temperate conditions than is possible with surface processing of the first coating 3.

The substrate 2 can also be pretreated before the steps described below in order to improve adhesion between the substrate 2 and first coating 3 (adhesion with the first coating 3 through the base layer 5). Pretreatment processes include cleaning by blasting, alkaline cleaning, acid cleaning, water washing, organic solvent cleaning, and bombardment cleaning, or etching. Particularly good adhesion between the substrate 2 and first coating 3 (adhesion with the first coating 3 through the base layer 5) can be achieved by using a cleaning process.

Base Layer Formation Process

At least one base layer is next formed (step 1b) on the surface of the substrate 2.

At least one base layer 5 is thus formed on the substrate 2 before the first coating 3 is formed. This enables rendering a decorative article 1 with particularly outstanding durability.

The base layer 5 can be rendered to impart any desired function, such as improving adhesion between the substrate 2 and first coating 3 (functioning as an adhesion improvement layer), repairing damage to the substrate 2 by surface leveling (functioning as a leveling layer), or functioning to buffer external shocks to the finished decorative article (functioning as a cushioning layer).

Materials that can be used for the base layer 5 include metals such as Ti, Zr, Hf, V, Nb, Ta, Cr, and Al, and alloys containing at least one of these, but Ti is preferred.

If the base layer 5 is made of primarily Ti, adhesion between the substrate 2 and first coating 3 can be further improved, and the reliability and durability of the decorative article 1 can be made particularly outstanding.

Furthermore, if the base layer 5 is made of primarily Ti, its function as a leveling layer smoothing the surface roughness of the substrate 2 is particularly good.

Furthermore, if the base layer 5 is made of primarily Ti, the base layer 5 functions more effectively as a cushioning layer buffering external impact to the substrate 2, and the decorative article 1 can be made particularly resistant to denting, for example.

The average thickness of the base layer 5 is not specifically limited, but is preferably in the range $0.03 \leq 1.5$ μm, and further preferably in the range $0.1 \leq 0.5$ μm. If the average thickness of the base layer 5 is within the foregoing range, an increase in internal stress in the base layer 5 and resulting cracks can be effectively prevented while the above-described functions of the base layer 5 are more effective.

The base layer 5 is formed on all of one side of the substrate 2 in the configuration shown in the figure, but may be rendered on only part of the substrate 2.

The method of forming the base layer 5 is not specifically limited, and various coating methods, wet plating methods, chemical vapor deposition (CVD) methods, dry plating methods (vapor phase epitaxy), and spray coating methods can be used, but a dry plating method is preferred. Examples of coating methods include spin coating, dipping, brushing, spray coating, electrostatic coating, and electrodeposition coating. Wet plating methods include electrolytic plating, immersion plating, and electroless plating. CVD methods include thermal CVD, plasma CVD, and laser CVD methods. Dry plating methods include vacuum deposition, sputtering, and ion plating.

Using a dry plating method to form the base layer 5 enables forming a homogenous base layer 5 with uniform film thickness and particularly outstanding adhesion with the substrate 2. The appearance and durability of the resulting decorative article 1 are therefore particularly outstanding.

Furthermore, using a dry plating method to form the base layer 5 enables minimizing variation in the film thickness even when the base layer 5 is relatively thin. This is also effective for improving the reliability of the decorative article 1.

Furthermore, if the first coating is formed by a dry plating method, the base layer formation process and the first coating formation process can be executed consecutively using the same device (without removing the substrate 2 from the process chamber) by, for example, changing the target and the composition of the process gas in the vapor phase epitaxy system (inside the chamber). Adhesion between the substrate 2, base layer 5, and first coating 3 is thus particularly outstanding, and production of the decorative article 1 can be improved.

In addition, if the base layer 5 is made of Ti, the base layer 5 and first coating 3 can be particularly desirably formed one after the other (continuously) by using the same target and changing the composition of the process gas in the vapor phase epitaxy system (inside the chamber).

A first coating 3 of primarily TiN is next formed on the substrate 2 on which the base layer 5 was formed (step 2b).

By rendering this first coating 3, dispersion of the components of the second coating 4″ rendered in a step described below can be prevented, and a decorative article 1 with the intended color (a decorative article 1 with a lustrous pink color) can be reliably produced.

In addition, by rendering this first coating 3, formation of solid solutions can be promoted in the heat treatment process described below, and a decorative article 1 with outstanding manufacturability can be achieved.

Furthermore, by rendering this first coating 3, cracks in the coating can be reliably prevented in the finished decorative article 1, and in the acid treatment process described below the acid used in the treatment can be reliably prevented from penetrating the second coating 4′ and damaging the base layer 5 or substrate 2. A drop in adhesion between the substrate 2 and the base layer 5, and in adhesion between the substrate 2 and the second coating 4 (adhesion thru the first coating 3 and substrate layer 5), can be prevented, and a finished decorative article 1 with particularly outstanding durability can be produced.

Furthermore, by rendering this first coating 3, the entire decorative article 1 can be imparted with outstanding hardness (here and below, on the side on which the first coating 3 and second coating 4 are disposed), and renders the decorative article 1 resistant to surface damage such as scratching, marring, and denting.

In addition, by rendering this first coating 3, the entire decorative article 1 can be imparted with a particularly outstanding appearance even when the thickness of the second coating 4 described below is relatively thin. More specifically, the effect of the color of the first coating 3 on the appearance of the decorative article 1 increases when the thickness of the second coating 4 described below is relatively thin, but because the color (chromaticity) of TiN (the first coating 3) and the color (chromaticity) of the second coating 4 are comparatively similar (the difference is small), a decorative article 1 with an overall outstanding appearance can be achieved even when the second coating 4 is relatively thin.

Yet further, if the second coating 4 becomes worn or peels as a result of using the decorative article 1 for a long time, the adverse effect on the aesthetic appearance of the decorative article 1 can be minimized.

However, when a first coating made of TiN is not formed, dispersion of the constituents of the second coating in the step described below cannot be prevented, and a decorative article with the intended color (a decorative article with a lustrous pink color) cannot be reliably produced because the dispersion rates of the constituents of the second coating in particular are different. Note that while dispersion of the constituents of the second coating can conceivably be prevented by omitting steps after the second coating formation step, the color will vary in different parts of the finished decorative article and a sufficiently outstanding appearance cannot be achieved.

Furthermore, when a first coating made of TiN is not disposed, the materials used in the second coating cannot be sufficiently rendered as a solid solution by means of the heat treatment process described below, and outstanding productivity manufacturing decorative articles cannot be achieved. This configuration also requires heat treatment under extreme conditions that may adversely affect the substrate, for example.

Furthermore, when a first coating made of TiN is not rendered, adhesion between the substrate and coating will drop when the acid treatment described below is applied, and sufficient durability and reliability cannot be achieved in the final finished decorative article.

Yet further, when a first coating made of TiN is not present, sufficiently high overall hardness cannot be achieved in the decorative article. As a result, the decorative article is easily subject to surface damage such as scratching, marring, and denting, and the durability and reliability of the decorative article are thus deficient.

The content of N ($X_{1N}$) in the first coating 3 is not specifically limited but is preferably 2.0 wt %≦29.0 wt %, further preferably 5.0 wt %—27.0 wt %, yet further preferably 7.0 wt %≦24.0 wt %, and most preferably 8.0 wt %≦16.0 wt %.

If the N content of the first coating 3 is a value within the foregoing range, dispersion of the constituents of the second coating 4" in the step described below can be more effectively prevented, and the color (chromaticity) of the first coating 3 can be optimized. As a result, a decorative article 1 with the intended color (a decorative article 1 with a lustrous pink color) can be reliably produced.

Furthermore, if the N content of the first coating 3 is a value within the foregoing range, the decorative article 1 can be rendered with higher hardness, damage to the substrate 2 and base layer 5 can be more reliably prevented in the heat treatment process described below, and a final finished decorative article 1 with particularly outstanding durability and reliability can be produced.

Furthermore, if the N content of the first coating 3 is a value within the foregoing range, formation of a solid solution in the heat treatment process described below can be effectively promoted, and the decorative article 1 can be manufactured with particularly outstanding productivity.

The first coating 3 may also contain constituents (component elements) other than Ti and N. Such configuration can further reduce the difference between the color of the first coating 3 and the color of the second coating 4 described below, and further increase the hardness of the first coating 3, for example.

While not specifically limited, the average thickness of the first coating 3 is preferably in the range 0.01≦5.0 μm, further preferably in the range 0.2 μm≦3.0 μm, and yet further preferably in the range 0.3 μm≦0.8 μm. If the average thickness of the first coating 3 is within the foregoing range, dispersion of the constituents of the second coating 4" in a step described below can be more effectively prevented, and the color (chromaticity) of the first coating 3 can be optimized. As a result, a decorative article 1 with the intended color (a decorative article 1 with a lustrous pink color) can be reliably produced.

Furthermore, if the N content of the first coating 3 is within the foregoing range, an increase in internal stress in the first coating 3 can be effectively prevented, the hardness of the decorative article 1 can be increased, damage to the substrate 2 and base layer 5 in the acid treatment process described below can be more reliably prevented, and particularly outstanding durability and reliability can be achieved in the final finished decorative article 1.

Furthermore, if the N content of the first coating 3 is within the foregoing range, formation of a solid solution in the heat treatment process described below can be more effectively promoted, and particularly outstanding productivity manufacturing decorative articles 1 can be achieved.

The first coating 3 may also have a plurality of regions with different compositions. For example, the first coating 3 may have a first region where the N content is a predetermined value X, and a second region where the N content is a predetermined X' that is greater than X. By rendering the first area on the substrate 2 side of the second area in this configuration, an increase in the internal stress of the first coating 3 can be more effectively prevented while the hardness of the first coating 3 can be further increased, and particularly outstanding adhesion can be achieved between the substrate 2 and first coating 3. As a result, the decorative article 1 can maintain a stable, particularly outstanding appearance over a longer time.

If the first coating 3 has a plurality of regions of different compositions (such as when it has a first region and second region as described above), the first coating 3 may be a laminate having a plurality of layers of different compositions, or the composition may vary in a gradient through the thickness of the layer.

The first coating 3 is rendered over the entire surface of the substrate 2 (over the entire surface of the base layer 5) in the configuration shown in the figure so that all of the first coating 3 contacts the base layer 5, but the first coating 3 only needs to be formed on at least a part of the substrate 2.

The method of forming the first coating 3 is not specifically limited, and various coating methods, wet plating methods, chemical vapor deposition (CVD) methods, dry plating methods (vapor phase epitaxy), and spray coating methods can be used, but a dry plating method (vapor phase epitaxy) is preferred. Examples of coating methods include spin coating, dipping, brushing, spray coating, electrostatic coating, and electrodeposition coating. Examples of wet plating methods include electrolytic plating, immersion plating, and electroless plating. CVD methods include thermal CVD, plasma CVD, and laser CVD methods. Dry plating methods include vacuum deposition, sputtering, and ion plating.

Using a dry plating method (vapor phase epitaxy) to form the first coating 3 enables forming a homogenous first coating 3 with uniform film thickness and particularly outstanding adhesion with the substrate 2 (adhesion through the substrate layer 5). The appearance and durability of the resulting decorative article 1 are therefore particularly outstanding.

Furthermore, using a dry plating method to form the first coating 3 enables minimizing variation in the film thickness even when the first coating 3 is relatively thin. This is also effective for improving the reliability of the decorative article 1. Furthermore, using a dry plating method to form the first coating 3 also enables more reliably controlling the N content of the first coating 3.

Of the group of dry plating methods noted above, ion plating is preferred. The effects described above are particularly dramatic when ion plating is used as the method of forming the first coating 3. More particularly, using ion plating to form the first coating 3 enables forming a homogenous first coating 3 with uniform film thickness and particularly outstanding adhesion with the substrate 2. The appearance and durability of the resulting decorative article 1 are therefore particularly outstanding.

Furthermore, using ion plating as the method of forming the first coating 3 enables minimizing variation in the film thickness even when the first coating 3 is relatively thin. This is also effective for improving the reliability of the decorative article 1. Furthermore, using an ion plating method to form the first coating 3 also enables more reliably controlling the N content of the first coating 3.

When a dry plating method such as described above is used, the first coating 3 can be formed easily and reliably by using a Ti target and a N (nitrogen) process environment. Nitrogen ($N_2$), for example, can be used as the process gas in this case. The composition (N content) of the formed first coating 3 can also be adjusted by, for example, appropriately adjusting the pressure of the gas environment.

The process gas may also contain an inert gas such as argon. This enables easily and reliably controlling the N content of the first coating 3 to a relatively low level.

Second Coating Formation Process

A second coating 4" is formed on the surface of the first coating 3 (step 1d) using a dry plating method.

Using a dry plating method renders a second coating 4" with outstanding adhesion to the first coating 3. As a result, the finished decorative article 1 has particularly outstanding corrosion resistance and durability. Furthermore, using a dry plating method enables forming a high density second coating 4". As a result, the second coating 4 has high luster and a particularly outstanding appearance.

Furthermore, by using a dry plating method, a uniform film thickness can be produced even when the thickness of the second coating 4" is relatively thin. Yet further, by using a dry plating method, the second coating 4" can be formed easily and reliably even when the second coating 4" has a complex composition containing elements other than the essential elements.

This step uses a target containing $70.0 \text{ wt\%} \leq 85.0 \text{ wt\%}$ Au and $15.0 \text{ wt\%} \leq 30.0 \text{ wt\%}$ Cu. By using such a target, the finished decorative article 1 can be rendered with a lustrous pink color and particularly outstanding appearance. The durability and reliability of the finished decorative article 1 can also be rendered sufficiently outstanding. In addition, Au and Cu are materials that do not easily produce allergic reactions. The invention is therefore desirably suitable for use in decorative articles (such as timepieces) that are used in contact with the skin.

However, if a target with a a composition other than the foregoing is used, producing a decorative article 1 with lustrous pink color and outstanding appearance is difficult.

The Au content of the target used in this step is, as described above, $70.0 \text{ wt\%} \leq 85.0 \text{ wt\%}$, but is preferably $72.5 \text{ wt\%} \leq 84.5 \text{ wt\%}$, and further preferably $75.0 \text{ wt\%} \leq 84.0 \text{ wt\%}$. The finished decorative article 1 can thus be rendered with a particularly outstanding appearance.

The Cu content of the target used in this step is, as described above, $15.0 \text{ wt\%} \leq 30.0 \text{ wt\%}$, but is preferably $15.5 \text{ wt\%} \leq 27.5 \text{ wt\%}$, and further preferably $16.0 \text{ wt\%} \leq 25.0 \text{ wt\%}$. The finished decorative article 1 can thus be rendered with a particularly outstanding appearance.

The target used in this step (and the formed second coating 4") may contain elements other than Au and Cu (referred to below as "essential elements"). However, if the target contains elements other than the essential elements, the content thereof (the total amount of the elements if two or more such elements are included) is preferably less than or equal to 1.5 wt % and further preferably less than or equal to 1.0 wt %.

Further preferably, the target in this step (and the formed second coating 4") does not contain any Ni. By using a target that does not contain any Ni, the decorative article 1 can be made hypoallergenic. As a result, the decorative article 1 is well suited to use as an external part of a watch (such as the case member (including the case member, the back cover, and a one-piece case including the case member and back cover in unison), watchbands (including the clasp, and the band-buckle coupling mechanism), the bezel (such as the rotating bezel), and the crown (such as a screw-lock type crown), and buttons) that comes in contact with the skin during use, and particularly parts that are in contact with the skin for extended periods of time.

The Ni content of the target (and the formed second coating 4") is preferably 100 ppm or less, and further preferably 50 ppm or less. This makes the foregoing effect even more pronounced.

Examples of dry plating methods include vacuum deposition, sputtering, CVD methods such as thermal CVD, plasma CVD, and laser CVD methods, ion plating, and ion injection, and of these sputtering in particular is preferred. Using sputtering as the dry plating method renders a finished decorative article 1 with a particularly outstanding appearance.

Furthermore, if the base layer formation step and first coating formation step are executed using a dry plating method, the base layer formation process, the first coating formation process, and the second coating formation process can be executed consecutively using the same device (without removing the substrate 2 from the process chamber) by, for example, changing the type of target and the composition of the process gas in the vapor phase epitaxy system (inside the chamber). As a result, adhesion between the substrate 2, base layer 5, first coating 3, and second coating 4 is particularly outstanding, and the productivity of decorative article 1 manufacturing can be improved.

The second coating 4" is rendered over the entire surface of the first coating 3 in the configuration shown in the figure so that all of the second coating 4" contacts the first coating 3, but the second coating 4" only needs to be formed on at least a part of the first coating 3.

Heat Treatment Process

A heating process and a cooling process are next applied to the substrate 2 on which the first coating 3 and second coating 4" are disposed (step 1e). This promotes conversion of the constituents of the second coating 4" into a solid solution, producing a second coating 4' and enabling rendering a finished decorative article 1 with a particularly outstanding appearance and corrosion resistance.

This process is executed by first applying a heating process that heats to $300° C. \leq 395° C.$, and then applying a cooling process. By applying a heat treatment (heating process and cooling process) under these conditions, the materials in the second coating 4" can be sufficiently converted to a solid solution. More specifically, because the first coating 3 is disposed on the back side of the second coating 4" to which the heating treatment is applied, diffusion of the constituents of the second coating 4" in this step is prevented, and formation of a solid solution is promoted. As a result, a solid solution can be efficiently produced from the constituents of the second coating 4" under the relatively mild conditions described above, and the finished decorative article 1 can be rendered with an outstanding appearance, durability and reliability. Outstanding productivity manufacturing decorative articles 1 can also be achieved.

However, when this heat treatment is not applied, the finished decorative article cannot be rendered with a sufficiently outstanding appearance and durability. In addition, by producing a solid solution under these conditions, the ratio of constituents not forming a solid solution can be made sufficiently low in the second coating 4' resulting from this step. As a result, variations in the quality of individual units can be suppressed when numerous decorative articles 1 are manufactured, and the decorative article 1 can be rendered with particularly high reliability.

The heating temperature (maximum temperature) of the heating process in this step is, as described above, $300° C. \leq 395° C.$, is preferably $320° C. \leq 390° C.$, and is further preferably $330° C. \leq 380° C.$ This makes the foregoing effects particularly pronounced, and enables manufacturing decorative articles 1 with a particularly outstanding appearance with greater productivity.

The heating time (the time held to 300° C. or higher) of the heating process in this step is preferably $15 \text{ minutes} \leq 180 \text{ minutes}$, further preferably $20 \text{ minutes} \leq 150 \text{ minutes}$, and yet further preferably $30 \text{ minutes} \leq 90 \text{ minutes}$. This makes the foregoing effects particularly pronounced, and enables manufacturing decorative articles 1 with a particularly outstanding appearance with greater productivity.

The cooling rate to 25° C. in the cooling process of this step is preferably 0.02° C./s≦0.03° C./s, further preferably 0.022° C./s≦0.028° C./s, and yet further preferably 0.024° C./s≦0.026° C./s. This makes the foregoing effects particularly pronounced, and enables manufacturing decorative articles 1 with a particularly outstanding appearance with greater productivity.

Acid Treatment Step

The constituents of the second coating 4' that are not converted to a solid solution by the heating step of the foregoing heat treatment process are then removed by an acid treatment step (1*f*). As a result, a decorative article 1 having a second coating 4 composed of a solid solution in which color variations are prevented can be obtained. More specifically, because the first coating 3 is disposed on the back side of the second coating 4' to which the heat treatment process is applied, the acid used in this step can be reliably prevented from penetrating the second coating 4' and damaging the base layer 5 or substrate 2, and a decorative article 1 with an outstanding appearance, durability and reliability can be produced.

The acid treatment in this step may use a desirable acid, but preferably exposes the second coating 4' to a 50 wt %≦70 wt % $HNO_3$ solution for 1 s≦180 s. As a result, a decorative article 1 with an outstanding appearance can be manufactured more reliably and with particularly high productivity.

The contact time between the $HNO_3$ solution and the second coating 4' is preferably 1 s≦180 s, and is more preferably 1 s≦90 s, and yet further preferably 2 s≦60 s. This makes the foregoing effects even more dramatic.

The process temperature in this step is preferably 5° C.≦50° C., further preferably 7° C.≦35° C., and yet further preferably 10° C.≦30° C.

Note that parts other than the second coating 4' (such as the bottom surface of the substrate 2 as seen in FIG. 1) may be covered with a mask during this step. As a result, the substrate 2, for example, can be more reliably protected from the adverse effects of the acid.

Note that it is sufficient if this step removes at least part of the constituents of the second coating 4' that do not form a solid solution, and constituents not rendered as a solid solution may remain, for example, in parts of the second coating 4 that are not exposed to the outside surface. Even in this configuration, the constituents of the second coating 4' are sufficiently converted to a solid solution by the heat treatment process of the invention described above, the remaining constituents not rendered as a solid solution are normally sufficiently few, and there is substantially no effect on the appearance of the decorative article 1.

A cleaning step such as a water wash is normally applied to the decorative article 1 after this step. This wash step can reliably remove any acid remaining on the decorative article 1, and can reliably prevent corrosion of the decorative article 1 over time.

Decorative Articles

Decorative articles according to the invention manufactured by a method such as described above are described in further detail below.

The decorative article 1 may be any kind of product with decorative qualities, including decorative figurines and other interior design goods and exterior design goods; jewelry; watch cases (including the case member, back cover, and one-piece cases including the case member and back cover in unison), watch bands (including the clasp, and the band-buckle coupling mechanism), the dial, timepiece hands, the bezel (such as the rotating bezel), and the crown (such as a screw-lock type crown), buttons, the crystal, glass frames, dial rings, spacers, packing, and other external timepiece parts; the base plate of the movement, wheels and wheel train bridges, the rotor and other internal timepiece parts; eyeglasses (such as the frame), necktie pins, cuff links, rings, necklaces, bracelets, anklets, broaches, pendants, earrings, pierced earrings, and other personal accessories; lighters and lighter cases, car tire rims, golf clubs and other sporting gods, name plates, panels, trophy cups, mechanical parts including housings, and various types of containers. Of these, the invention is particularly suited to external timepiece parts.

External parts for timepieces require a beautiful appearance as decorative articles while also being utilitarian articles requiring durability, corrosion resistance, scratch resistance, wear resistance, and a particularly pleasing texture, and all of these conditions can be met by the present invention.

Note that an external timepiece part as used herein is any part that is visible from the outside, is not limited to parts exposed on the outside of a timepiece, and may be a part that is used inside the timepiece, such as the timepiece dial.

While not specifically limited, the average thickness of the second coating 4 of the decorative article 1 is preferably 0.02 μm≦2.0 μm, further preferably 0.03 μm≦0.8 μm, and yet further preferably 0.05 μm≦0.20 μm. If the average thickness of the second coating 4 is in the foregoing range, the decorative article 1 can be rendered with a particularly outstanding appearance and durability. If the average thickness is below the foregoing range, pinholes occur easily in the second coating 4 and the effect of the invention may not be sufficiently achieved. However, if the average thickness of the second coating 4 exceeds the foregoing range, the internal stress of the second coating 4 increases, adhesion between the first coating 3 and second coating 4 drops, and cracks develop easily. The hardness of the decorative article 1 also tends to drop if the average thickness of the second coating 4 exceeds the foregoing range.

Furthermore, producing a second coating 4 as described above renders the decorative article 1 with an extremely smooth surface. This can reduce or prevent surface coarseness, and reduce or prevent undesirable rubbing when the decorative article 1 is in contact with the skin, for example.

The Vickers hardness Hv measured with a 10 gf load on the side of the decorative article 1 to which the second coating 4 is disposed is preferably 500≦1000, and is further preferably 550≦800. This enables retaining outstanding appearance as a decorative article for a longer time.

Using the L*a*b* chromaticity diagram specified in JIS Z8729, the color of the surface of the decorative article 1 on the side to which the second coating 4 is disposed is preferably in the range of a*=7.0≦15.0 and b*=15.0≦27.0, further preferably in the range a*=8.0≦13.0 and b*=17.0≦25.0, and yet further preferably in the range a*=9.0≦11.0 and b*=18.0≦23.0. This achieves a decorative article 1 with a particularly outstanding appearance.

Using the L*a*b* color chart specified in JIS 28729, the color of the surface of the decorative article 1 to which the second coating 4 is disposed preferably has an L* in the range of L*=75.0≦89.0, further preferably in the range L*=78.0≦88.0, and yet further preferably in the range L*=82.0≦87.0. This achieves a decorative article 1 with a particularly outstanding appearance.

Timepiece

A timepiece according to the invention incorporating a decorative article according to the invention is described next.

Figure 2:
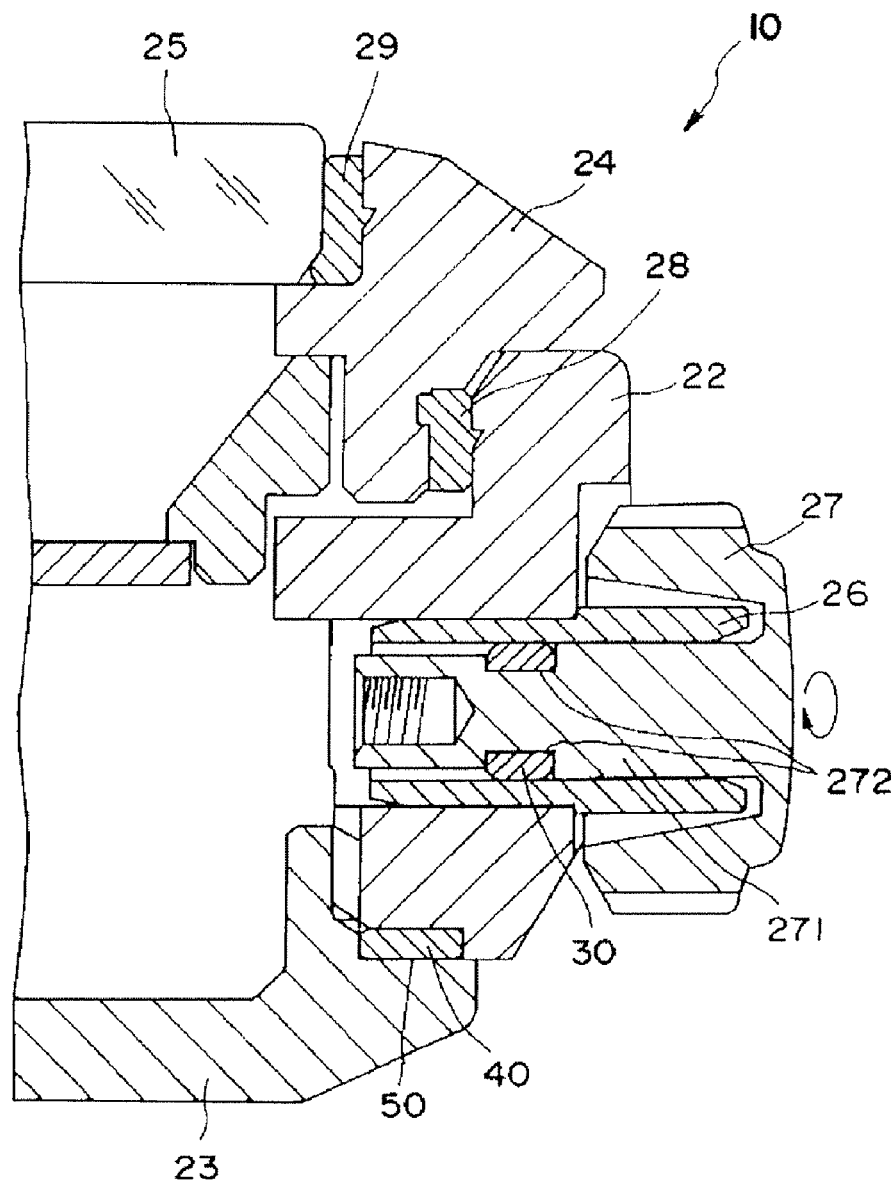
FIG. 2 is a partial section view showing a preferred embodiment of a timepiece (portable timepiece) according to the invention.

FIG. 2 is a partial section view showing a preferred embodiment of a timepiece (a portable timepiece) according to the invention.

As shown in FIG. 2, a wristwatch (portable timepiece) 10 according to this embodiment of the invention has a case member 22, a back cover 23, a bezel 24, and a glass crystal 25. A movement not shown (such as an analog movement having a dial and hands) is housed inside the case member 22.

A stem pipe 26 is fit and fastened to the case member 22, and the stem 271 of the crown 27 is inserted freely rotatably inside the stem pipe 26.

The case member 22 and bezel 24 are fastened by plastic packing 28, and the bezel 24 and glass crystal are secured by plastic packing 29.

The back cover 23 is fit (or threaded) to the case member 22, and a rubber O-ring (back cover packing) 40 is compressed and inserted to the connection (seal) 50 therebetween. This makes the seal 50 watertight and imparts water resistance.

A groove 272 is formed around the outside of the middle part of the stem 271 of the crown 27, and an O-ring (crown packing) 30 is fit into this groove 272. The O-ring 30 fits tight to the inside surface of the stem pipe 26, and is compressed between this inside surface and the inside surface of the groove 272. This forms a watertight seal between the crown 27 and the stem pipe 26, and provides water resistance. When the crown 27 is wound, the O-ring 30 turns with the stem 271 and slides circumferentially along the inside surface of the stem pipe 26.

In a wristwatch 10 according to this embodiment of the invention at least one of a group of decorative articles (particularly external parts of the timepiece) including the bezel 24, case member 22, crown 27, back cover 23, and wristband is a decorative article according to the invention described above.

Preferred embodiments of the invention are described above, but the invention is not so limited.

For example, the method of manufacturing the decorative article according to the invention may include other steps for particular purposes as required. For example, an intermediate process such as a cleaning process may be inserted between the first coating formation process and the second coating formation process, or between the base layer formation process and first coating formation process. A pretreatment process including cutting, grinding, polishing, or honing, for example, may also be applied to the substrate.

The foregoing embodiments are described with reference to an embodiment forming the first coating by means of vapor phase film deposition, but the first coating may be formed by applying a nitriding process to a film made of Ti.

The foregoing embodiment describes a typical configuration having a base layer, but the base layer may be omitted. Furthermore, the foregoing embodiment describes forming the first coating and second coating on one surface of the substrate, but the first coating and second coating may be formed on plural surfaces of the substrate.

A protective layer imparting corrosion resistance, weather resistance, water resistance, oil resistance, scratch resistance, wear resistance, or resistance to color change can also be formed on at least part of the surface of the decorative article to improve protection against rust, soiling, dulling, and scratching. This protective coating may also be a coating this is removed when the decorative article is used, for example.

The invention is also described above with the first coating and second coating in contact with each other, but one or more intermediate layers may be disposed between the first coating and second coating. This can be used, for example, to further improve adhesion between the first coating and second coating.

Exemplary Embodiments

Some exemplary embodiments of the invention are described next.

1. Manufacturing a Decorative Article

Embodiment 1

A decorative article, specifically part of a wristwatch case (the back cover), was manufactured by the method described below.

A substrate having the desired shape of a wristwatch case (back cover) was manufactured by a casting technique using stainless steel (SUS 444), and then ground and polished as required.

This substrate was then cleaned. The base material was cleaned by electrolytic alkaline degreasing for 30 seconds followed by dipping in an alkaline degreasing solution for 30 seconds. Then followed neutralization for 10 seconds, a water wash for 10 seconds, and a demineralized water wash for 10 seconds.

Using a vapor phase epitaxy system as described above, a base layer of Ti was formed on the cleaned substrate as described below.

First, the process chamber of the vapor phase epitaxy system was vented (pressure reduced) to $3 \times 10^{-3}$ Pa while preheating the chamber.

Argon gas for cleaning was then introduced to the chamber and the workpiece was cleaned for 5 minutes by applying a DC voltage of 350 V.

Argon was then introduced to the process chamber to a gas pressure of 53 Pa, and 400 VDC was applied and held for 45 minutes. A base layer of Ti was then formed (base layer formation step) using a Ti target, 30-V ionization voltage, 20-A ionization current, and 20 minute process time. The average thickness of the resulting base layer was 0.5 μm.

A first coating of TiN was then formed on the surface of the base layer by ion plating using the vapor phase epitaxy system described above (first coating formation process). The first coating was formed as described below.

First, while preheating the process chamber of the vapor phase epitaxy system, the chamber was vented (pressure reduced) to $2 \times 10^{-3}$ Pa. Nitrogen gas was then introduced at a flow rate of 40 ml/min and the gas pressure (total pressure) inside the chamber was adjusted to $1.8 \times 10^{-3}$ Pa. While then continuing to supply nitrogen gas, ion plating (first coating formation process) using a Ti target commenced and continued for 19 minutes using a 50-V ionization voltage and 40-A ionization current. This produced a TiN first coating with an average thickness of 0.5 μm. The N content of the resulting first coating was 15.0 wt %.

A second coating of an Au—Cu alloy was then formed on the surface of the first coating by sputtering using the foregoing vapor phase epitaxy system (second coating formation process). The second coating was formed as described below.

First, the process chamber of the vapor phase epitaxy system was vented (pressure reduced) to $1.0 \times 10^{-1}$ Pa while preheating the chamber.

Argon gas was then introduced at a flow rate of 40 ml/min, and a second coating of a Au—Cu alloy was formed by using a target made of 82.5 wt % Au and 17.5 wt % Cu while discharging a 650-V, 2.0-A current for 5.0 minutes.

Next, using anon-oxidizing furnace, the workpiece was heated for 60 minutes at 350° C. (maximum temperature), and then cooled to 25° C. at a cooling rate of 0.024° C./s in a cooling process (heat treatment step).

Next, parts of the substrate other than the second coating to which the heat treatment process (heating process and cooling process) was applied were covered with an acrylic mask, and the workpiece was immersed for 3 seconds in a solution of 60 wt % $HNO_3$ at 25° C. (acid treatment step).

The workpiece was then washed in water for 10 seconds, washed in demineralized water for 10 seconds, and dried. The mask was then removed to get the decorative article (timepiece case (back cover)). The average thickness of the second coating on the decorative article thus produced was 0.08 µm.

Note that the thickness of the base layer, the first coating, and the second coating was measured by the microscopic cross-sectional test method described in JIS H 5821.

Embodiments 2 to 6

These decorative articles (timepiece case member (back cover)) were manufactured in the same way as the first embodiment described above except for modifying the composition of the target used in the second coating formation process and the conditions of the heat treatment process and the conditions of the acid treatment process as shown in FIG. 1, and adjusting or selecting the process time and the composition of the target used in the base layer formation process, the process time and flow rate of the nitrogen in the first coating formation process, and the process time of the second coating formation process to achieve the configurations shown in Table 1.

Embodiment 7

Except for using a substrate made of Ti, a decorative article (wristwatch case (back cover)) was manufactured in the same way as the first embodiment described above.

The substrate was manufactured by metal injection molding (MIM) as described below.

First, Ti powder with a 52 µm average grain size manufactured by a gas atomization method was prepared.

A material containing 75 vol % of this Ti powder, 8 volt polyethylene, 7 vol % polypropylene, and 10 vol % paraffin wax was kneaded. A kneader was used to knead this material. The material temperature during kneading was 60° C.

The kneaded material was then ground and graded to obtain pellets with an average grain size of 3 mm. Using these pellets in an injecting molding machine, moldings in the shape of the wristwatch case were manufactured by metal injection molding (MIM). The moldings were made with consideration for shrinkage in the debindering process and during sintering. Molding conditions during injection molding were a 40° C. mold temperature, 80 kgf/cm² injection pressure, 20 second injection time, and 40 second cooling time.

Next, a debindering process was applied to the molding using a degreasing oven to obtain a degreased molding. For the debindering process the molding was left in a $1.0 \times 10^{-1}$ Pa argon gas atmosphere at 80° C. for 1 hour, and the temperature was then raised to 400° C. at 10° C./hour. Sample weight was measured during the heat treatment to find the point at which weight loss ended as the debindering completion point.

The resulting degreased molding was then sintered in a sintering oven to obtain the substrate. Sintering was done by heating in a $1.3 \times 10^{-3}$ to $1.3 \times 10^{-4}$ Pa argon gas atmosphere at 900° C. to 1100° C. for 6 hours.

The substrate thus obtained was then cut and polished as required, and the substrate was then cleaned. The substrate was cleaned by electrolytic alkaline degreasing for 30 seconds followed by dipping in an alkaline degreasing solution for 30 seconds. Then followed neutralization for 10 seconds, a water wash for 10 seconds, and a demineralized water wash for 10 seconds.

Embodiments 8 to 12

These decorative articles (timepiece case member (back cover)) were manufactured in the same way as the seventh embodiment described above except for modifying the composition of the target used in the second coating formation process and the conditions of the heat treatment process and the conditions of the acid treatment process as shown in FIG. 1, and adjusting or selecting the process time and the composition of the target used in the base layer formation process, the process time and flow rate of the nitrogen in the first coating formation process, and the process time of the second coating formation process to achieve the configurations shown in Table 1.

Embodiment 13

Except for making the substrate by casting a Cu—Zn alloy (containing 60 wt % Cu and 40 wt % Zn), and omitting the base layer formation step, a decorative article (wristwatch case (back cover)) was manufactured in the same way as embodiment 1 described above.

Comparison 1

Except for omitting the first coating formation process, a decorative article (wristwatch case (back cover)) was manufactured in the same way as embodiment 13 described above. In this comparison sample the second coating was formed directly on the surface of the substrate.

Comparison 2

Except for omitting the second coating formation process, a decorative article (wristwatch case (back cover)) was manufactured in the same way as embodiment 13 described above. The decorative article according to this comparison sample therefore included only the substrate and first coating, and did not have the second coating described above.

Comparison 3

A decorative article (wristwatch case (back cover)) was manufactured by the method described below.

First, a Ti substrate was prepared as described in embodiment 7.

The substrate was then cleaned. The substrate was cleaned by electrolytic alkaline degreasing for 30 seconds followed by dipping in an alkaline degreasing solution for 30 seconds. Then followed neutralization for 10 seconds, a water wash for 10 seconds, and a demineralized water wash for 10 seconds.

A carburization process was then applied to this cleaned substrate to form a carburized layer (TiC) made of TiC.

Carburizing was done using the plasma carburization process described below.

A carburization system was prepared by placing a process chamber surrounded by insulation such as graphite fiber insulation in an oven, heating the process chamber using a heating element made of graphite rods, connecting the anode of the DC glow discharge to the top of the process chamber, connecting the cathode to the workpiece stand, and disposing a gas manifold at the required location inside the chamber for appropriately introducing hydrocarbon, nitrogen, argon, hydrogen, or other process gases (including gas for carburization and a dilution gas).

The substrate was then placed in the process chamber of the carburization system and the pressure in the process chamber reduced to 1.3 Pa. The substrate was then heated to app 300° C. by a heater while a held in the low pressure process chamber.

Argon gas for cleaning was then introduced to the chamber for a 5 minute cleaning process. The cleaning process was done by applying a 350-V DC voltage.

Propane was then introduced to the chamber until the gas composition inside the chamber was substantially 1000 propane, the gas pressure was adjusted to 53 Pa, and 400 VDC was applied and held for 140 minutes for plasma carburization. Argon and nitrogen gas was then pressure fed into the chamber to cool the substrate to normal temperature. This carburization process produced a carburized layer approximately 15 μm thick.

The decorative article (wristwatch case (back cover)) was then acquired by forming the second coating as described in embodiment 13 above on the surface of the carburized layer.

Comparisons 4-6

Except for changing the target used in the second coating formation process as shown in Table 2, decorative articles (wristwatch cases (back covers)) were produced as described in embodiment 13 above.

Comparison 7

Except for omitting the heat treatment process, a decorative article (wristwatch case (back cover)) was produced as described in embodiment 13 above.

Comparisons 8 and 9

Except for changing the conditions of the heat treatment process as shown in Table 2, decorative articles (wristwatch cases (back covers)) were produced as described in embodiment 13 above.

Comparison 10

Except for omitting the acid treatment process, a decorative article (wristwatch case (back cover)) was produced as described in embodiment 13 above.

The compositions of the foregoing embodiments and the comparison samples are shown in Table 1 and Table 2. Note that in Table 1 and Table 2 "SUS" denotes stainless steel, and BS denotes Cu—Zn alloy. In addition, the values for the carburized layer formed by the carburization process in comparison 3 in Table 3 are shown in the column for the first coating.

In addition, the maximum temperature (set temperature) used in the heating process is shown in the process temperature column of the heating process in Table 1 and Table 2, the time held at or above 300° C. is shown in the process time column of the heating process, and the cooling rate to 25° C. is shown in the cooling rate column of the cooling process. The Ni content in the second coating of the decorative article was 10 ppm or less in each of the embodiments.

TABLE 1

| | Production conditions | | | | | | Composition of decorative article | | | | | | | |
|---|---|---|---|---|---|---|---|---|---|---|---|---|---|---|
| | 2nd coating formation process | | | Heat treatment process | | | Acid process | | Base layer | | First coating | | | Second coating |
| | Target composition | | | Heating | | Cooling | Process | | | Avg | | | | Avg | Avg |
| | Au | Cu | Ni | Temp (° C.) | Time (min) | Rate (° C./s) | time (sec) | Substrate Material | Material | thick (μm) | Ti (wt %) | N (wt %) | C (wt %) | thick (μm) | thick (μm) |
| Embodiment 1 | 82.5 | 17.5 | — | 350 | 60 | 0.024 | 3 | SUS | Ti | 0.5 | 85.0 | 15.0 | — | 0.5 | 0.08 |
| Embodiment 2 | 75.0 | 25.0 | — | 330 | 90 | 0.023 | 2 | SUS | Ti | 0.2 | 91.8 | 8.2 | — | 0.3 | 0.16 |
| Embodiment 3 | 82.0 | 18.0 | — | 380 | 20 | 0.021 | 1.5 | SUS | Al | 0.6 | 91.4 | 8.6 | — | 0.7 | 0.25 |
| Embodiment 4 | 72.5 | 27.5 | — | 360 | 30 | 0.022 | 1 | SUS | Ti | 0.04 | 88.8 | 11.2 | — | 0.8 | 0.12 |
| Embodiment 5 | 83.5 | 16.5 | — | 310 | 100 | 0.029 | 4 | SUS | Al | 0.1 | 87.4 | 12.6 | — | 0.6 | 0.10 |
| Embodiment 6 | 84.9 | 15.1 | — | 390 | 15 | 0.028 | 5 | SUS | Ti | 0.4 | 83.7 | 16.3 | — | 0.2 | 0.12 |
| Embodiment 7 | 82.5 | 17.5 | — | 350 | 60 | 0.024 | 3 | Ti | Ti | 0.5 | 85.0 | 15.0 | — | 0.5 | 0.08 |
| Embodiment 8 | 81.5 | 18.5 | — | 360 | 70 | 0.025 | 3 | Ti | Ti | 0.3 | 84.5 | 15.5 | — | 1.3 | 0.11 |
| Embodiment 9 | 84.0 | 16.0 | — | 380 | 30 | 0.026 | 6 | Ti | Ti | 0.4 | 89.4 | 10.6 | — | 0.7 | 0.16 |
| Embodiment 10 | 70.0 | 30.0 | — | 390 | 15 | 0.027 | 90 | Ti | Ti | 0.7 | 87.4 | 12.6 | — | 0.5 | 0.12 |
| Embodiment 11 | 80.2 | 19.8 | — | 320 | 40 | 0.029 | 20 | Ti | Ti | 0.5 | 83.9 | 16.1 | — | 0.3 | 0.06 |
| Embodiment 12 | 83.0 | 17.0 | — | 340 | 20 | 0.030 | 5 | Ti | Al | 0.04 | 84.9 | 15.1 | — | 0.4 | 0.13 |
| Embodiment 13 | 82.5 | 17.5 | — | 350 | 60 | 0.024 | 3 | BS | — | — | 85.0 | 15.0 | — | 0.5 | 0.08 |

TABLE 2

| | Production conditions | | | | | | Composition of decorative article | | | | | | | |
|---|---|---|---|---|---|---|---|---|---|---|---|---|---|---|
| | 2nd coating formation process | | | Heat treatment process | | | Acid process | | Base layer | | First coating | | | Second coating |
| | Target composition | | | Heating | | Cooling | Process | | | Avg | | | | Avg | Avg |
| | Au | Cu | Ni | Temp (° C.) | Time (min) | Rate (° C./s) | time (sec) | Substrate Material | Material | thick (μm) | Ti (wt %) | N (wt %) | C (wt %) | thick (μm) | thick (μm) |
| Comparison 1 | 82.5 | 17.5 | — | 350 | 60 | 0.024 | 3 | BS | — | — | — | — | — | — | 0.08 |
| Comparison 2 | — | — | — | 350 | 60 | 0.024 | 3 | BS | — | — | 85.0 | 15.0 | — | 0.5 | — |
| Comparison 3 | 82.5 | 17.5 | — | 350 | 60 | 0.024 | 3 | Ti | — | — | 91.2 | — | 8.8 | 15.0 | 0.08 |
| Comparison 4 | 86.0 | 14.0 | — | 350 | 60 | 0.024 | 3 | BS | — | — | 85.0 | 15.0 | — | 0.5 | 0.08 |
| Comparison 5 | 69.0 | 31.0 | — | 350 | 60 | 0.024 | 3 | BS | — | — | 85.0 | 15.0 | — | 0.5 | 0.06 |
| Comparison 6 | 68.0 | 31.0 | 1.0 | 350 | 60 | 0.024 | 3 | BS | — | — | 85.0 | 15.0 | — | 0.5 | 0.04 |

TABLE 2-continued

| | Production conditions | | | | | | | Composition of decorative article | | | | | | |
|---|---|---|---|---|---|---|---|---|---|---|---|---|---|---|
| | 2nd coating formation process | | | Heat treatment process | | | Acid process | Base layer | | | First coating | | | Second coating |
| | Target composition | | | Heating | | Cooling Rate | Process time | Substrate | | Avg thick | Ti | N | C | Avg thick |
| | Au | Cu | Ni | Temp (° C.) | Time (min) | (° C./s) | (sec) | Material | Material | (μm) | (wt %) | (wt %) | (wt %) | (μm) | Avg thick (μm) |
| Comparison 7 | 82.5 | 17.5 | — | — | — | — | 3 | BS | — | — | 85.0 | 15.0 | — | 0.5 | 0.04 |
| Comparison 8 | 82.5 | 17.5 | — | 290 | 180 | 0.024 | 3 | BS | — | — | 85.0 | 15.0 | — | 0.5 | 0.06 |
| Comparison 9 | 82.5 | 17.5 | — | 400 | 60 | 0.024 | 3 | BS | — | — | 85.0 | 15.0 | — | 0.5 | 0.07 |
| Comparison 10 | 82.5 | 17.5 | — | 350 | 60 | 0.024 | — | BS | — | — | 85.0 | 15.0 | — | 0.5 | 0.08 |

2. Visual Evaluation of Appearance

The appearance of the side on which the coatings were disposed in each of the decorative articles manufactured as described in the embodiments and comparison samples above was inspected visually.

2-1 Evaluation Based on Color of Decorative Article

The color (including luster) of the side on which the coatings were disposed in each of the decorative articles manufactured as described in the embodiments and comparison samples above was inspected and graded in three levels.

A: had the intended color (lustrous pink color)
B: had a color that differed slightly from the intended color (lustrous pink color)
C: had a color that was completely different from the intended color (lustrous pink color)

2-2 Evaluation of Color Variation in the Decorative Article

The occurrence of color variation on the side on which the coatings were disposed in each of the decorative articles manufactured as described in the embodiments and comparison samples above was inspected and graded in the following five levels.

A: no color variation observed
B: substantially no color variation observed
C: slight color variation observed
D: obvious color variation observed
E: severe color variation observed 2-3 Evaluation of General Appearance The general appearance of the side on which the coatings were disposed in each of the decorative articles manufactured as described in the embodiments and comparison samples above was inspected and graded in the following five levels.

A: excellent appearance
B: good appearance
C: defects apparent
D: poor appearance
E: extremely poor appearance 3. Evaluation of Appearance Using a Spectrophotometer 3-1 Evaluation of a* and b*

The color of the side on which the coatings were disposed was measured for each of the decorative articles manufactured as described in the above embodiments and comparison samples using a spectrophotometer (Minolta, CM-2022), and the color was graded in four levels as described below.

A: a* is $9.0 \leq 11.0$ and b* is $18.0 \leq 23.0$ in the L*a*b* color space defined in JIS Z 8729

B: a* is $7.0 \leq 15.0$ and b* is $15.0 \leq 27.0$ in the L*a*b* color space defined in JIS Z 8729 (except not including the range for grade A)

C: a* is $6.0 \leq 16.0$ and b* is $14.0 \leq 30.0$ in the L*a*b* color space defined in JIS Z 8729 (except not including the ranges for grades A and B)

D: a* is $6.0 \leq 16.0$ and b* is outside $14.0 \leq 30.0$ in the L*a*b* color space defined in JIS Z 8729

The light source for the spectrophotometer was a $D_{65}$ light source defined in JIS Z 8720, and measurements were taken at a viewing angle of 2°.

3-2 Evaluation of L*

The color of the surface on which the coatings were formed was measured for each of the decorative articles manufactured as described in the above embodiments and comparison samples using a spectrophotometer (Minolta, CM-2022), and the color was graded in four levels as described below.

A: L* in the range $82.0 \leq 87.0$ in the L*a*b* color space defined in JIS Z 8729

B: L* in the range $78.0 \leq 88.0$ in the L*a*b* color space defined in JIS Z 8729 (except not including the range for A)

C: L* in the range $75.0 \leq 89.0$ in the L*a*b* color space defined in JIS Z 8729 (except not including the ranges for A and B)

E: L* outside the range $75.0 \leq 89.0$ in the L*a*b* color space defined in JIS Z 8729 (except not including the ranges for A, B, and C)

The light source for the spectrophotometer was a $D_{65}$ light source defined in JIS Z 8720, and measurements were taken at a viewing angle of 2°.

4. Long-term Stability Evaluation 4-1 Visual Inspection

The decorative articles manufactured in the embodiments and comparisons described above were left for 80 days at normal temperature (25° C.), normal pressure, and 75% RH, the side on which the coatings were formed on the decorative article was then inspected, and the occurrence of color variations was evaluated according to the following five grades.

A: no color variation observed
B: substantially no color variation observed
C: slight color variation observed
D: obvious color variation observed
E: severe color variation observed 4-2 Evaluation Using a Spectrophotometer The decorative articles manufactured in the embodiments and comparisons described above were left for 80 days at normal temperature (25° C.), normal pressure, and 75% RH, the color of the side on which the coatings were formed on the decorative article was then measured using a spectrophotometer (Minolta, CM-2022), and the color difference before and after exposure to said environment was graded in four levels as described below.

A: color difference $\Delta E < 3$
B: $3 \leq$ color difference $\Delta E < 4$
C: $4 \leq$ color difference $\Delta E < 5$
D: $5 \leq$ color difference $\Delta E$ The light source for the spectrophotometer was a $D_{65}$ light source defined in JIS Z 8720, and measurements were taken at a viewing angle of 2°.

5. Oxidation Resistance Evaluation 5-1 Visual Inspection

The decorative articles manufactured as described in the foregoing embodiments and comparison samples were left at 200° C. for 8 hours at normal pressure, the side on which the coatings were formed on the decorative articles was then visually inspected, and the occurrence of color variations was ranked according to the following five grades.

A: no color variation observed

B: substantially no color variation observed

C: slight color variation observed

D: obvious color variation observed

E: severe color variation observed 5-2 Evaluation Using a Spectrophotometer

The decorative articles manufactured as described in the foregoing embodiments and comparison samples were left at 200° C. for 8 hours at normal pressure, the color of the side on which the coatings were formed on the decorative articles was then measured using a spectrophotometer (Minolta, CM-2022), and the color difference before and after exposure to said environment was graded in four levels as described below.

A: color difference $\Delta E < 3$

B: $3 \leq$ color difference $\Delta E < 4$

C: $4 \leq$ color difference $\Delta E < 5$

D: $5 \leq$ difference $\Delta E$

The light source for the spectrophotometer was a $D_{65}$ light source defined in JIS Z 8720, and measurements were taken at a viewing angle of 2°.

6. Chemical Resistance Evaluation

The chemical resistance of the decorative articles manufactured in each of the embodiments and comparisons described above was evaluated after an air exposure test as described below.

6-1 Visual Inspection

Artificial perspiration was placed in a dessicator and left at 45° C. for 12 hours. The decorative articles were then placed in the dessicator and left at 45° C. The decorative articles were placed so that they were not immersed in the artificial perspiration. After 30 hours the decorative articles were removed from the dessicator, the side on which the coating was formed was visually inspected, and the appearance of color variations was ranked according to the following five grades.

A: no color variation observed

B: substantially no color variation observed

C: slight color variation observed

D: obvious color variation observed

E: severe color variation observed

Artificial perspiration was placed in a dessicator and left at 45° C. for 12 hours. The decorative articles were then placed in the dessicator and left at 45° C. The decorative articles were placed so that they were not immersed in the artificial perspiration. After 30 hours the decorative articles were removed from the dessicator, the color of the side on which the coatings were formed on the decorative articles was then measured using a spectrophotometer (Minolta, CM-2022), and the color difference before and after the exposure test was graded in four levels as described below.

A: color difference $\Delta E < 3$

B: $3 \leq$ color difference $\Delta E < 4$

C: $4 \leq$ color difference $\Delta E < 5$

D: $5 \leq$ color difference $\Delta E$

The light source for the spectrophotometer was a $D_{65}$ light source defined in JIS Z 8720, and measurements were taken at a viewing angle of 2°.

7. Coating Adhesion Evaluation

The adhesion of the coatings (first coating, second coating, base layer) of the decorative articles manufactured in each of the embodiments and comparisons described above was evaluated using the test described below.

Each decorative article was subjected to the following heat cycle test.

Each decorative article was left at rest for 1.5 hours at 20° C., then 2 hours at 65° C., then 1.5 hours at 20° C., and then 3 hours at −15° C. The ambient temperature was then returned to 20° C. to complete one cycle (8 hours). Each sample was subjected to 3 cycles (24 hours).

The appearance of each sample was then visually inspected and graded according to the four levels described below.

A: no lifting or separation of the coating

B: substantially no lifting of the coating observed

C: obvious lifting of the coating observed

D: obvious cracking or separation of the coating observed

8. Scratch Resistance

The scratch resistance of the decorative articles manufactured in each of the embodiments and comparisons described above was tested and evaluated as described below.

Using a Suga abrasion tester (NUS-ISO-1, manufactured by Suga Test Instruments) with a 200 gf load, the side of the decorative article on which the coating was formed (the opposite side as the side on which the surface of the substrate is exposed) was rubbed with a total 300 double strokes (DS). The appearance of the surface was then visually evaluated and graded according to the following four levels. Note that the test was conducted using a lapping sheet (aluminum oxide with 30 μm grain size) manufactured by Sumitomo 3M Ltd.

A: no surface scratching observed

B: substantially no surface scratching observed

C: slight surface scratching observed

D: conspicuous surface scratching or separation of the coating observed

9. Dent Resistance

The dent resistance of the decorative articles manufactured in each of the embodiments and comparisons described above was evaluated as described below.

A stainless steel ball (1 cm diameter) was dropped from a height of 60 cm onto the side of the decorative article on which the coating was formed, and the size of any dent in the surface of the decorative article (the diameter of the dent) was measured and graded according to the following four levels.

A: dent diameter<1 mm, or no dent observed

B: 1 mm$\leq$dent diameter<2 mm

C: 2 mm$\leq$dent diameter<3 mm

D: 3 mm$\leq$dent diameter

The results of these tests are shown together with the Vickers hardness of the coating in Table 3 and Table 4. Note that Vickers hardness Hv was measured at the surface of the decorative article (the surface on the side where the coating was formed) using a 10 gf test load.

TABLE 3

| | Vickers hardness | Appearance | | | Spectrophotometer | | Long-term stability | | Oxidation resistance | |
|---|---|---|---|---|---|---|---|---|---|---|
| | | Visual Color | Variation | General | a*b* | L* | Visual | Spectrophotometer | Visual | Spectrophotometer |
| Embodiment 1 | 600 | A | A | A | A | A | A | A | A | A |
| Embodiment 2 | 550 | A | A | A | A | A | A | A | A | A |
| Embodiment 3 | 600 | A | B | B | A | A | B | A | B | A |
| Embodiment 4 | 650 | A | B | B | A | A | B | A | B | A |
| Embodiment 5 | 600 | A | A | B | A | A | A | A | A | A |
| Embodiment 6 | 550 | A | A | B | B | A | A | A | A | A |
| Embodiment 7 | 600 | A | A | A | A | A | A | A | A | A |
| Embodiment 8 | 750 | A | A | A | A | A | A | A | A | A |
| Embodiment 9 | 650 | A | A | A | A | A | A | A | A | A |
| Embodiment 10 | 600 | A | A | B | B | B | A | A | B | B |
| Embodiment 11 | 550 | A | A | B | A | A | A | A | A | A |
| Embodiment 12 | 600 | A | A | B | B | A | A | A | A | A |
| Embodiment 13 | 600 | A | A | A | A | A | A | A | B | B |

| | Chemical resistance | | Coating adhesion | Scratch resistance | Dent resistance |
|---|---|---|---|---|---|
| | Visual | Spectrophotometer | | | |
| Embodiment 1 | A | A | A | A | A |
| Embodiment 2 | A | A | A | A | A |
| Embodiment 3 | B | A | B | A | A |
| Embodiment 4 | B | A | B | A | A |
| Embodiment 5 | A | A | B | A | A |
| Embodiment 6 | A | B | A | A | B |
| Embodiment 7 | A | A | A | A | A |
| Embodiment 8 | A | A | B | A | A |
| Embodiment 9 | A | A | A | A | A |
| Embodiment 10 | A | B | B | A | B |
| Embodiment 11 | A | A | A | A | A |
| Embodiment 12 | A | A | B | B | A |
| Embodiment 13 | A | A | B | A | A |

TABLE 4

| | Vickers hardness | Appearance | | | Spectrophotometer | | Long-term stability | | Oxidation resistance | |
|---|---|---|---|---|---|---|---|---|---|---|
| | | Visual Color | Variation | General | a*b* | L* | Visual | Spectrophotometer | Visual | Spectrophotometer |
| Comparison 1 | 180 | C | E | E | C | C | E | C | E | D |
| Comparison 2 | 600 | C | A | E | D | D | A | A | A | A |
| Comparison 3 | 600 | B | C | D | D | D | C | B | D | C |
| Comparison 4 | 600 | B | C | C | C | B | C | A | C | A |
| Comparison 5 | 600 | B | D | D | D | C | D | C | D | D |
| Comparison 6 | 600 | B | D | D | D | C | E | D | E | D |
| Comparison 7 | 600 | B | D | D | B | B | E | B | E | B |
| Comparison 8 | 600 | B | D | C | B | B | E | C | E | C |
| Comparison 9 | 600 | B | C | C | B | B | C | B | C | B |
| Comparison 10 | 600 | B | E | D | C | C | E | D | E | D |

| | Chemical resistance | | Coating adhesion | Scratch resistance | Dent resistance |
|---|---|---|---|---|---|
| | Visual | Spectrophotometer | | | |
| Comparison 1 | E | C | D | D | D |
| Comparison 2 | A | A | A | A | A |
| Comparison 3 | C | B | C | C | B |
| Comparison 4 | C | B | B | B | B |
| Comparison 5 | D | D | B | B | B |
| Comparison 6 | E | D | B | B | B |
| Comparison 7 | E | B | B | B | A |
| Comparison 8 | D | C | B | B | A |

TABLE 4-continued

| | | | | | |
|---|---|---|---|---|---|
| Comparison 9 | C | B | B | B | A |
| Comparison 10 | E | D | C | C | C |

As shown in Table 3 and Table 4, the decorative article according to the invention exhibits an outstanding appearance, and more particularly an outstanding appearance with a lustrous pink color.

The decorative article according to the invention also features excellent long-term stability, oxidation resistance, chemical resistance, and coating adhesion.

The decorative article according to the invention also has high hardness and excellent resistance to scratching and denting.

As a result, a decorative article according to the invention can retain an outstanding appearance for a long time.

The decorative article of the invention also has an outstanding surface texture with no surface roughness.

Satisfactory results were not obtained with the comparison samples, however.

A wristwatch as shown in FIG. 2 was also assembled using the decorative articles described in the foregoing embodiments and comparison samples. When the wristwatch was evaluated using the tests described above, the same results were achieved.

In addition, while the invention enables reliably manufacturing decorative articles with stable quality and little difference in the characteristics of individual units, variation in the appearance and quality of the comparison samples was great.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

The entire disclosure of Japanese Patent Application No. 2009-268039, filed Nov. 25, 2009 is expressly incorporated by reference herein.

What is claimed is:

1. A method of manufacturing a decorative article, comprising:
   a first coating formation step of forming a first coating of primarily TiN on a substrate;
   a second coating formation step of forming a second coating on the first coating by means of a dry plating method using a target containing 70.0 wt %$\leqq$85.0 wt % Au and 15.0 wt %$\leqq$30.0 wt % Cu;
   a heat treatment step of promoting formation of a solid solution of the constituents of the second coating by applying a heating process that heats the substrate on which the first coating and the second coating are disposed to 300° C.$\leqq$395° C. and then applying a cooling process; and
   an acid treatment step that, of the constituents of the second coating to which the heating process was applied, removes the constituents not forming a solid solution by applying an acid treatment.

2. The method of manufacturing a decorative article described in claim 1, wherein:
   the acid treatment step causes the second coating supplied to the heat treatment step to contact a 50 wt %$\leqq$70 wt % $HNO_3$ solution for 1 second$\leqq$180 second.

3. The method of manufacturing a decorative article described in claim 1, further comprising:
   a base layer formation step that forms at least one base layer on the substrate before the first coating formation step.

4. The method of manufacturing a decorative article described in claim 3, wherein:
   a layer of primarily Ti is formed as the base layer.

5. The method of manufacturing a decorative article described in claim 1, wherein:
   the substrate is made of primarily Ti and/or stainless steel at least near the surface.

6. The method of manufacturing a decorative article described in claim 1, wherein:
   the N content of the first coating disposed to the decorative article is 2.0 wt %$\leqq$29.0 wt %.

7. The method of manufacturing a decorative article described in claim 1, wherein:
   the average thickness of the first coating disposed to the decorative article is 0.1 µm$\leqq$5.0 µm.

8. The method of manufacturing a decorative article described in claim 1, wherein:
   the average thickness of the second coating disposed to the decorative article is 0.02 µm$\leqq$2.0 µm.

* * * * *